(12) United States Patent
Peng

(10) Patent No.: US 8,007,297 B1
(45) Date of Patent: Aug. 30, 2011

(54) DEVICE WITH INTERFACE PORT PROTECTION COVER

(75) Inventor: Da-Yi Peng, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/034,689

(22) Filed: Feb. 24, 2011

(30) Foreign Application Priority Data

Sep. 29, 2010 (CN) .......................... 2010 1 0296607

(51) Int. Cl.
*H01R 13/44* (2006.01)
(52) U.S. Cl. ...................................................... 439/142
(58) Field of Classification Search .................. 439/136, 439/142
See application file for complete search history.

(56) References Cited

U.S. PATENT DOCUMENTS 6,267,608 B1 * 7/2001 Yagi .............................. 439/142
6,991,490 B1 * 1/2006 Su .................................. 439/142

\* cited by examiner

*Primary Examiner* — Tho D Ta
(74) *Attorney, Agent, or Firm* — Altis Law Group, Inc.

(57) ABSTRACT

A device includes a housing, an interface port protection cover, at least one slots, and at least one connecting members which includes a connecting portion and a sliding portion. Each connecting member defines a guide slot along a longitudinal direction of the sliding portion. The connecting portion is connected to the cover, and the sliding portion extends through the corresponding slot. The housing defines one guide protrusion and one limiting protrusion protruding from a bottom thereof corresponding to each slot. The guide protrusion and the limiting protrusion are slidably received in the guide slot, and one end of the guide slot resists against the limiting protrusion. When a user mistakenly attempts to rotate the cover by moving a first end of the cover which is adjacent to the sliding portion, the end of the guide slot resists against the limiting protrusion and the protection cover cannot move.

9 Claims, 5 Drawing Sheets

DEVICE WITH INTERFACE PORT PROTECTION COVER

BACKGROUND

1. Technical Field

The present disclosure relates to a device having an interface port protection cover.

2. Description of Related Art

Electronic devices such as cell phones and notebook computers usually include one or more interface ports, such as USB ports, memory card connectors, etc. To protect these ports, a cover is usually connected to the housing of the electronic devices. One known method utilizes a rubber connecting member to connect the cover to the housing. The cover can rotate with respect to the housing, allowing the interface port to be exposed. One problem with this kind of cover is that the rubber may not be strong enough to withstand mishandling by a user.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
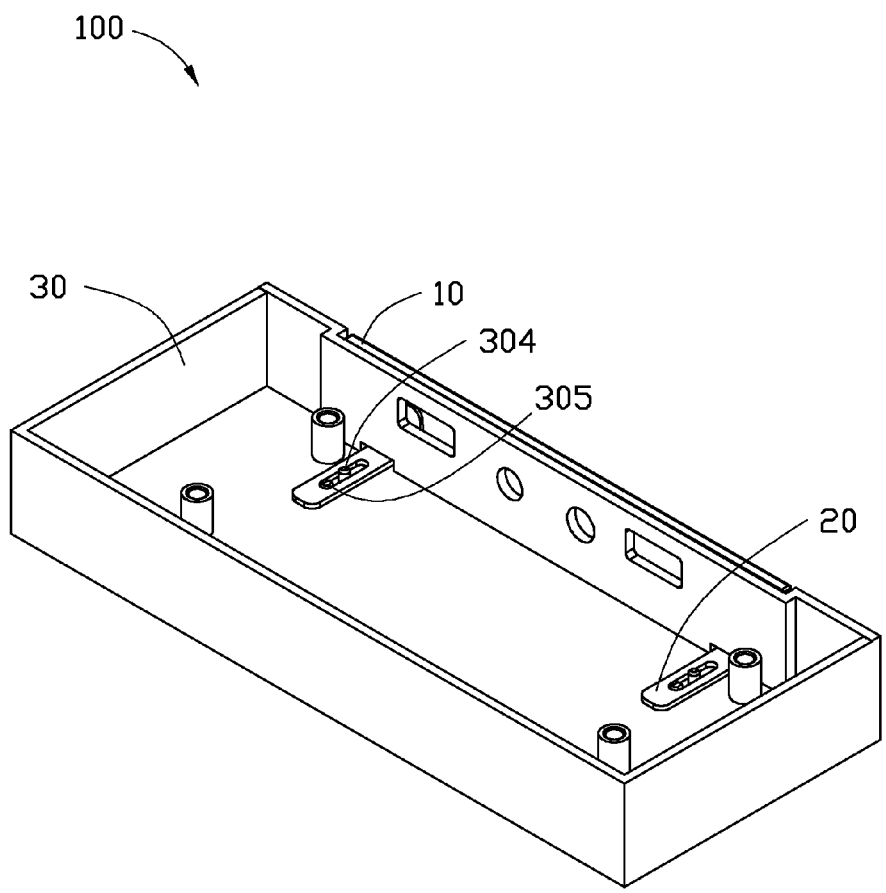
FIG. 1 is an isometric view of a device with an interface cover, in accordance with an exemplary embodiment.
Figure 2:
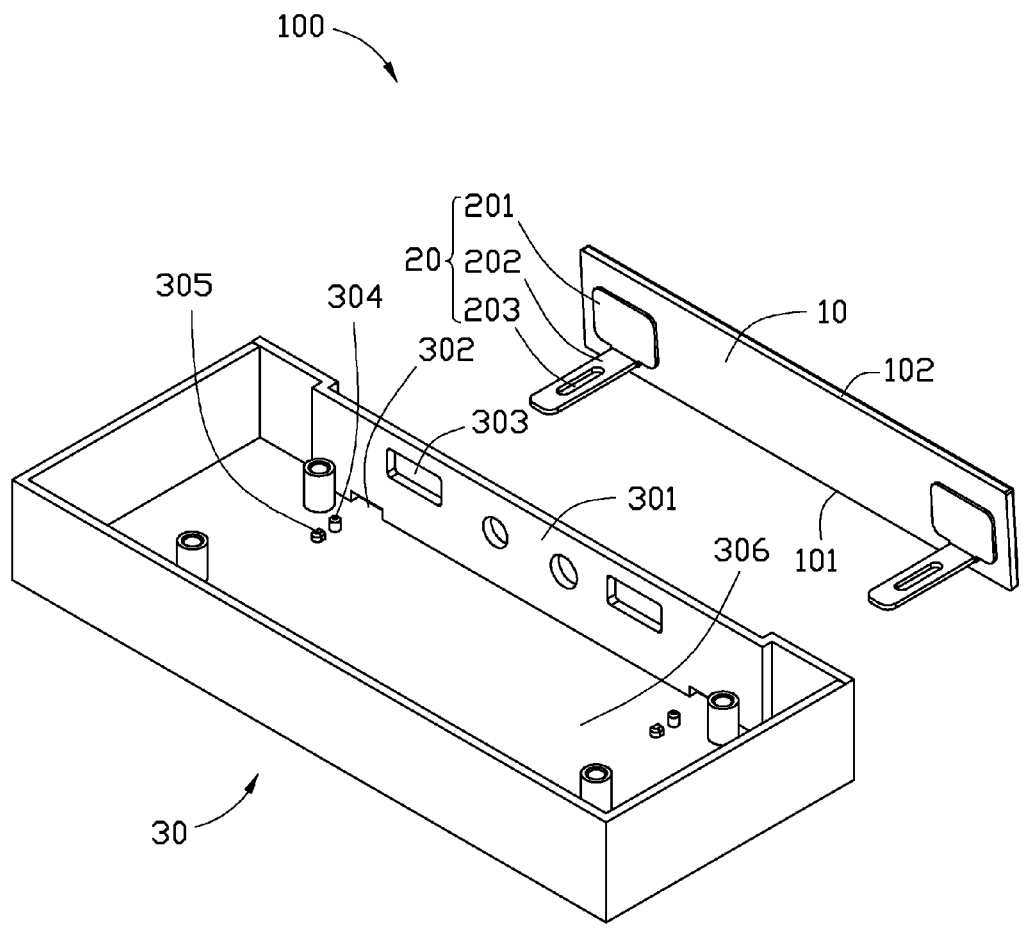
FIG. 2 is an exploded view of the device of FIG. 1.

Referring to FIGS. 1-2, a device 100 includes an interface port protection cover 10, at least one connecting member 20, and a housing 30. In this embodiment, the device 100 includes two connecting members 20. The housing 30 is hollow and includes four sidewalls and a bottom 306. One sidewall 301 of the housing 30 defines a number of openings 303 to respectively allow a number of connectors to be exposed. The protection cover 10 includes a first end 101 and a second end 102. The protection cover 10 is connected to the sidewall 301 by the connecting members 20 to shield the openings 303 of the housing 30. In this embodiment, the device 100 is an electronic device, such as a mobile phone, an audio player, a digital camera, portable computer and the like.

Each connecting member 20 is made of elastic material and deformable. In this embodiment, the connecting members 20 are made of rubber. Each connecting member 20 includes a connecting portion 201 and a sliding portion 202. The sliding portion 202 is strip-shaped and defines a guide slot 203 along a longitudinal direction of the sliding portion 202. One end of the sliding portion 202 is connected to the connecting portion 201 and the other end is free. The connecting portion 201 is fixed to an inner side of the first end 101 of the cover 10. In an initial state, the sliding portion 202 is perpendicular to the cover 10.

The housing 30 further defines at least one slot 302 in the side wall 301 corresponding to the connecting members 20, and one guide protrusion 304 and one limiting protrusion 305 protruding from the bottom 306 is corresponding to each of the at least one slot 302. In this embodiment, the housing 30 includes two slots 302, two guide protrusions 304, and two limiting protrusions 305. Each slot 302 and its corresponding guide protrusion 304 and limiting protrusion 305 are arranged in a line in that order. The limiting protrusion 305 defines an arcuate top. The limiting protrusion 305 is shorter than the guide protrusion 304, and about the same thickness as the sliding portion 202 of the connecting member 20. The sliding portion 202 of each connecting member 20 extends through the corresponding slot 302, and the corresponding guide protrusion 304 and the limiting protrusion 305 are slidably received in the guide slot 203 of the connecting member 20.

Figure 3:
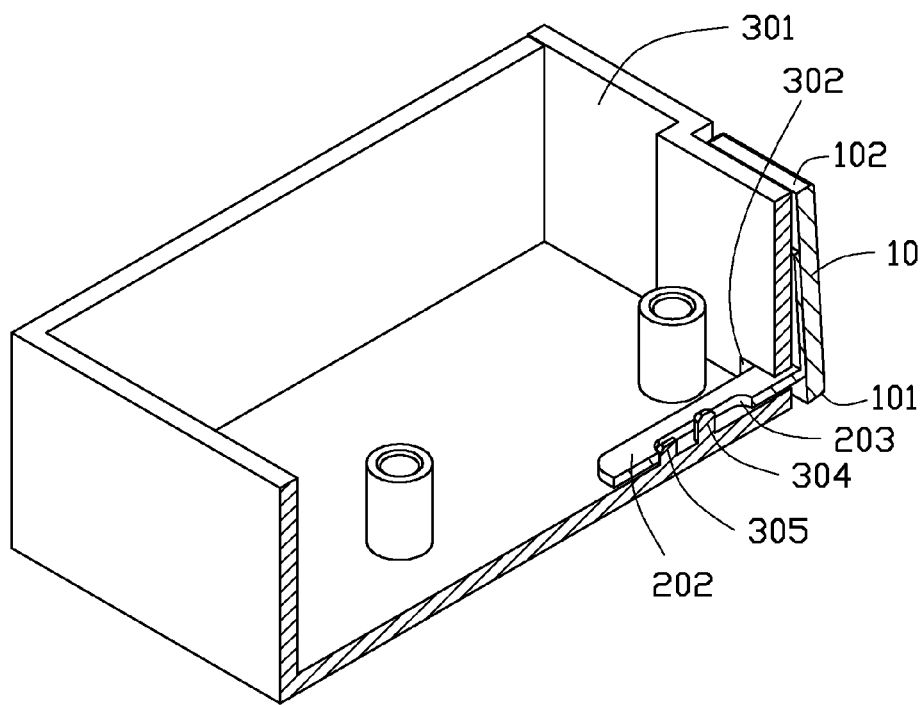
FIG. 3 is an isometric, cutaway view of the device of FIG. 1.

Referring to FIG. 3, in an initial state, one end of the guide slot 203, which is away from the connecting portion 201, resists against the limiting protrusion 305 and the cover 10 resists against the side wall 301. When a user mistakenly attempts to rotate the cover 10 by operating the first end 101 of the cover 10 adjacent to the sliding portion 202, the end of the guide slot 203 resists against the limiting protrusion 305, the sliding portion 202 is prevented from moving and the protection cover 10 cannot move.

Figure 4:
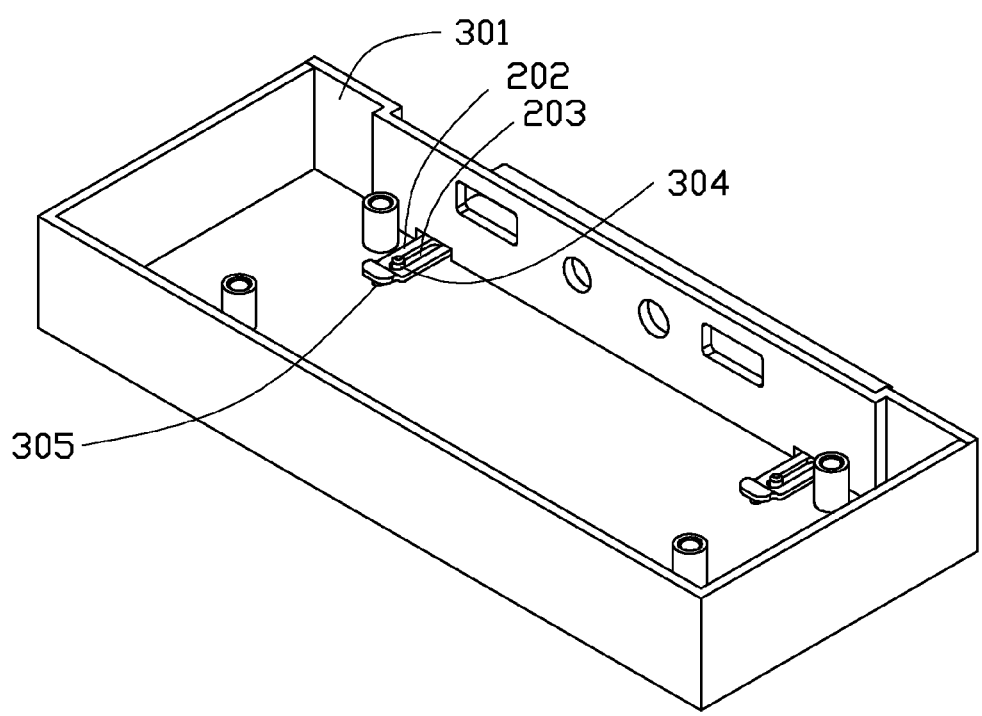
FIG. 4 is an isometric view of the device of FIG. 1, showing the interface port protection cover in an open state.
Figure 5:
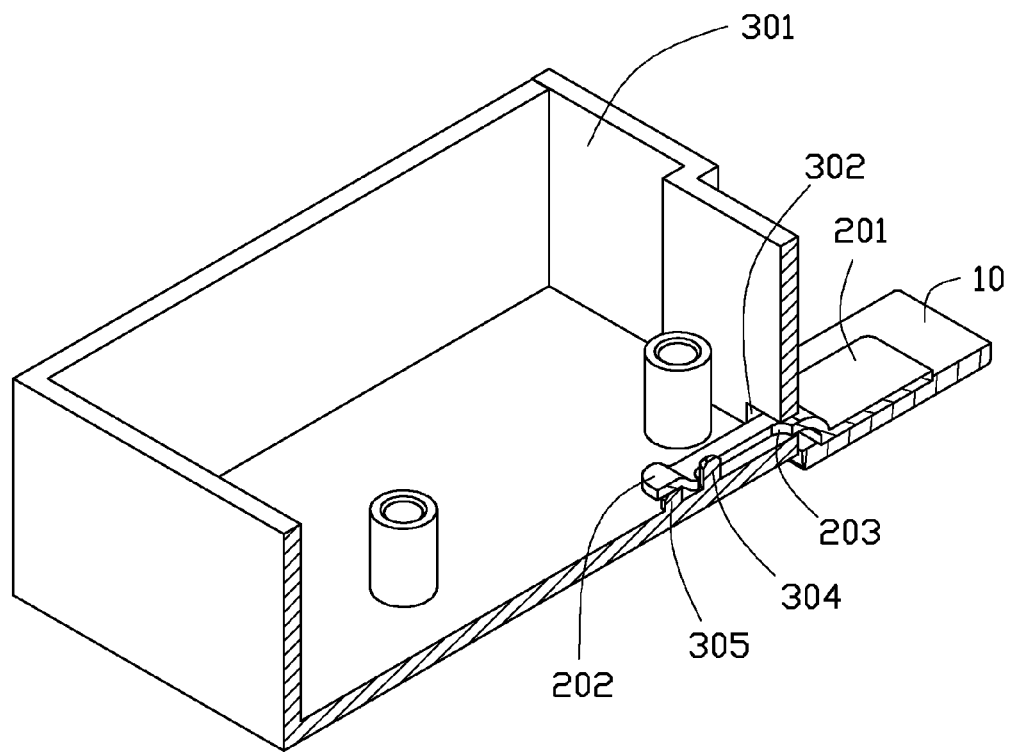
FIG. 5 is an isometric, cutaway view of the device of FIG. 4.

Referring to FIGS. 4-5, when attempts to correctly rotate the cover 10 by moving the second end 102 away from the sliding portion 202, the cover 10 overcomes the elastic force of the connecting member 20 and rotates away from the side wall 301. The rotation of the cover 10 causes the connecting member 20 to rotate along with the cover 10 and the end of the sliding portion 202, which is away from the connecting portion 201, moves toward the arcuate top of the limiting protrusion 305, and the arcuate top of the limiting protrusion 305 allows the sliding portion to move over the limiting protrusion 305. When the cover 10 is rotated to a position where the first end 101 of the cover 10 starts to resist against the bottom 306 of the housing 30, further rotation of the cover 10 will cause the sliding portion 202 of the connecting member 20 to be pulled. Under the pulling force, the sliding portion 202 moves over the top of the limiting protrusion 305 and slides over the top of the limiting protrusion 305. The sliding portion 202 is stopped when the end of the guide slot 203 engages the guide protrusion 304. Once the cover 10 is rotated to a position substantially parallel to the bottom 306, the interface ports are totally exposed for use.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A device with an interface port protection cover, comprising:

a housing defining a plurality of openings in a sidewall thereof to respectively allow a plurality of interface ports to be exposed, and defining at least one slot in the sidewall, the housing comprising one guide protrusion, and one limiting protrusion, protruding from a bottom thereof, corresponding to each of the at least one slot, each of the at least one limiting protrusion comprising an arcuate top, the guide protrusion being arranged between the corresponding one of the at least one slot and the corresponding one of the at least one limiting protrusion;

an interface port protection cover to shield the plurality of openings of the housing, comprising a first end and a second end; and at least one connecting member, corresponding to the at least one slot, connecting the interface port protection cover to the side wall of the housing, each of the at least one connecting member comprising:

a connecting portion fixed to the first end of an inner side of the protection cover;

a sliding portion connected to the connecting portion, and defining a guide slot along a longitudinal direction of the sliding portion, one end of the sliding portion being connected to the connecting portion, and the other opposite end of the sliding portion extending through a corresponding one of the at least one slot of the housing, wherein the corresponding guide protrusion and the corresponding limiting protrusion are slidably received in the guide slot of the connecting member, the arcuate top of the limiting protrusion allows the sliding portion to move over the limiting protrusion when the sliding portion is pulled by the cover which is rotated with the first end resisting against the housing, the sliding portion is prevented from moving by the at least one limiting protrusion when the interface port protection cover is operated with the second end resisting against the housing.

2. The device with an interface port protection cover according to claim 1, wherein the at least one connecting member is made of elastic material.

3. The device with an interface port protection cover according to claim 2, wherein the at least one connecting member is made of rubber.

4. The device with an interface port protection cover according to claim 1, wherein the number of the at least one connecting member is two, and the number of the at least one slot, the at least one guide protrusion and the at least one limiting protrusion are two corresponding to the connecting members.

5. The device with an interface port protection cover according to claim 1, wherein the height of the limiting protrusion is less than that of the guide protrusion and about the same with the thickness of the sliding portion of the connecting member.

6. A device with an interface port protection cover, comprising:

a housing defining a plurality of openings in a sidewall thereof to respectively allow a plurality of interface ports to be exposed, and defining two slots in the sidewall, the housing comprising one guide protrusion, and one limiting protrusion, protruding from a bottom thereof, corresponding to each of the two slot, each of the two limiting protrusion comprising an arcuate top, the guide protrusion being arranged between the corresponding one of the two slot and the corresponding one of the two limiting protrusions;

an interface port protection cover to shield the plurality of openings of the housing, comprising a first end and a second end; and two connecting members, corresponding to the two slot, connecting the interface port protection cover to the side wall of the housing, each of the two connecting member comprising:

a connecting portion fixed to the first end of an inner side of the protection cover;

a sliding portion connected to the connecting portion, and defining a guide slot along a longitudinal direction of the sliding portion, one end of the sliding portion being connected to the connecting portion, and the other opposite end of the sliding portion extending through a corresponding one of the at least one slot of the housing, wherein the corresponding guide protrusion and the corresponding limiting protrusion are slidably received in the guide slot of the connecting member, the arcuate top of the limiting protrusion allows the sliding portion to move over the limiting protrusion when the sliding portion is pulled by the cover which is rotated with the first end resisting against the housing, the sliding portion is prevented from moving by the at least one limiting protrusion when the interface port protection cover is operated with the second end resisting against the housing.

7. The device with an interface port protection cover according to claim 6, wherein the two connecting members are made of elastic material.

8. The device with an interface port protection cover according to claim 7, wherein the two connecting members are made of rubber.

9. The device with an interface port protection cover according to claim 6, wherein the height of each limiting protrusion is less than that of each guide protrusion and about the same with the thickness of the sliding portion of each connecting member.

* * * * *